(12) United States Patent
Andrews et al.

(10) Patent No.: US 9,627,361 B2
(45) Date of Patent: Apr. 18, 2017

(54) MULTIPLE CONFIGURATION LIGHT EMITTING DEVICES AND METHODS

(75) Inventors: Peter S. Andrews, Durham, NC (US); Raymond Rosado, Apex, NC (US); Michael P. Laughner, Cary, NC (US); David T. Emerson, Chapel Hill, NC (US); Jeffrey C. Britt, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/017,575

(22) Filed: Jan. 31, 2011

(65) Prior Publication Data

US 2012/0086024 A1  Apr. 12, 2012

Related U.S. Application Data

(60) Provisional application No. 61/390,966, filed on Oct. 7, 2010.

(51) Int. Cl.
| | |
|---|---|
| *H01L 29/18* | (2006.01) |
| *H01L 25/075* | (2006.01) |
| *H01L 33/58* | (2010.01) |
| *H01L 33/62* | (2010.01) |

(52) U.S. Cl.
CPC .......... *H01L 25/0753* (2013.01); *H01L 33/58* (2013.01); *H01L 33/62* (2013.01); *H01L 2224/48091* (2013.01); *H01L 2924/01322* (2013.01); *H01L 2924/19107* (2013.01)

(58) Field of Classification Search
CPC ..................................... H01L 33/0004–33/648
USPC .................. 257/79–103, 666–677, 748–749, 257/781–784, E33.066, E23.031–E23.05, 257/E23.141; 438/110–111, 121–127
See application file for complete search history.

(56) References Cited

U.S. PATENT DOCUMENTS

| | | | |
|---|---|---|---|
| 4,946,547 | A | 8/1990 | Palmour et al. |
| 5,200,022 | A | 4/1993 | Kong et al. |
| 5,210,051 | A | 5/1993 | Carter |
| RE34,861 | E | 2/1995 | Davis et al. |
| 5,393,993 | A | 2/1995 | Edmond et al. |
| 5,523,589 | A | 6/1996 | Edmond et al. |
| D615,504 | S | 5/2010 | Keller et al. |

(Continued)

FOREIGN PATENT DOCUMENTS

| | | |
|---|---|---|
| CN | ZL201130227081.6 | 5/2013 |
| EP | 2 625 726 | 8/2013 |

(Continued)

OTHER PUBLICATIONS

Notice of Allowance for U.S. Appl. No. 29/384,476 dated Aug. 6, 2011.

(Continued)

*Primary Examiner* — Cuong B Nguyen
(74) *Attorney, Agent, or Firm* — Jenkins, Wilson, Taylor & Hunt, P.A.

(57) ABSTRACT

Multiple configuration light emitting diode (LED) devices and methods are disclosed wherein LEDs within the device can be selectively configured for use in higher voltage, or variable voltage, applications. Variable arrangements of LEDs can be configured. Arrangements can include one or more LEDs connected in series, parallel, and/or a combination thereof. A surface over which one or more LEDs may be mounted can comprise one or more electrically and/or thermally isolated portions.

28 Claims, 7 Drawing Sheets

(56) References Cited

U.S. PATENT DOCUMENTS

| | | |
|---|---|---|
| 7,791,061 B2 | 9/2010 | Edmond et al. |
| D631,020 S | 1/2011 | Chuang et al. |
| D637,565 S | 5/2011 | Wu et al. |
| D650,343 S | 12/2011 | Andrews |
| 2006/0186418 A1 | 8/2006 | Edmond et al. |
| 2007/0158668 A1 | 7/2007 | Tarsa et al. |
| 2007/0235863 A1 | 10/2007 | Lee et al. |
| 2008/0099772 A1 | 5/2008 | Shuy et al. |
| 2008/0173884 A1 | 7/2008 | Chitnis et al. |
| 2008/0179611 A1 | 7/2008 | Chitnis et al. |
| 2008/0258130 A1 | 10/2008 | Bergmann et al. |
| 2008/0258156 A1 | 10/2008 | Hata |
| 2009/0108281 A1* | 4/2009 | Keller et al. ............... 257/98 |
| 2009/0230413 A1 | 9/2009 | Kobayakawa et al. |
| 2009/0273925 A1* | 11/2009 | Schultz et al. ........ 362/249.01 |
| 2010/0006868 A1 | 1/2010 | Lin |
| 2010/0140634 A1 | 6/2010 | Van de Ven et al. |
| 2010/0252851 A1 | 10/2010 | Emerson et al. |
| 2011/0062482 A1 | 3/2011 | Solomensky et al. |
| 2011/0127912 A1 | 6/2011 | Lee et al. |
| 2011/0133217 A1* | 6/2011 | Hakamata ......... F21S 48/1109 257/88 |
| 2011/0133224 A1* | 6/2011 | Zoorob et al. ............... 257/88 |
| 2011/0248289 A1* | 10/2011 | Hsieh et al. ................. 257/88 |

FOREIGN PATENT DOCUMENTS

| | | |
|---|---|---|
| TW | D148141 | 7/2012 |
| TW | D148142 | 7/2012 |
| TW | I482312 B | 4/2015 |
| WO | WO 2010/015825 | 2/2010 |
| WO | WO 2012/047790 A2 | 4/2012 |

OTHER PUBLICATIONS

International Search Report for Application Serial No. PCT/US2011/054563 dated May 15, 2012.

Notice to Grant for Chinese Application No. 201130227081.6 dated Jan. 23, 2013.

Korean Office Action for Application No. 10-2013-7011652 dated Jun. 23, 2014.

Taiwanese Office Action for Application No. 100136315 dated Jul. 25, 2014.

Taiwanese Notice of Allowance for Application No. 100136315 dated Dec. 30, 2014.

Korean Notice of Allowance of Application No. 10 2013 7011652 dated Oct. 30, 2015.

* cited by examiner

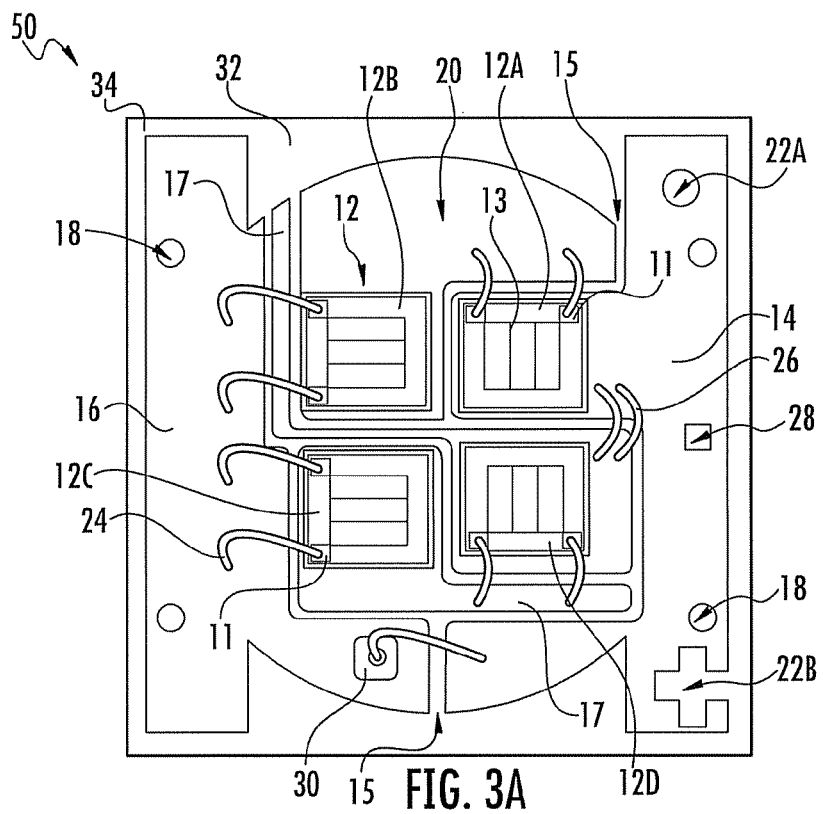
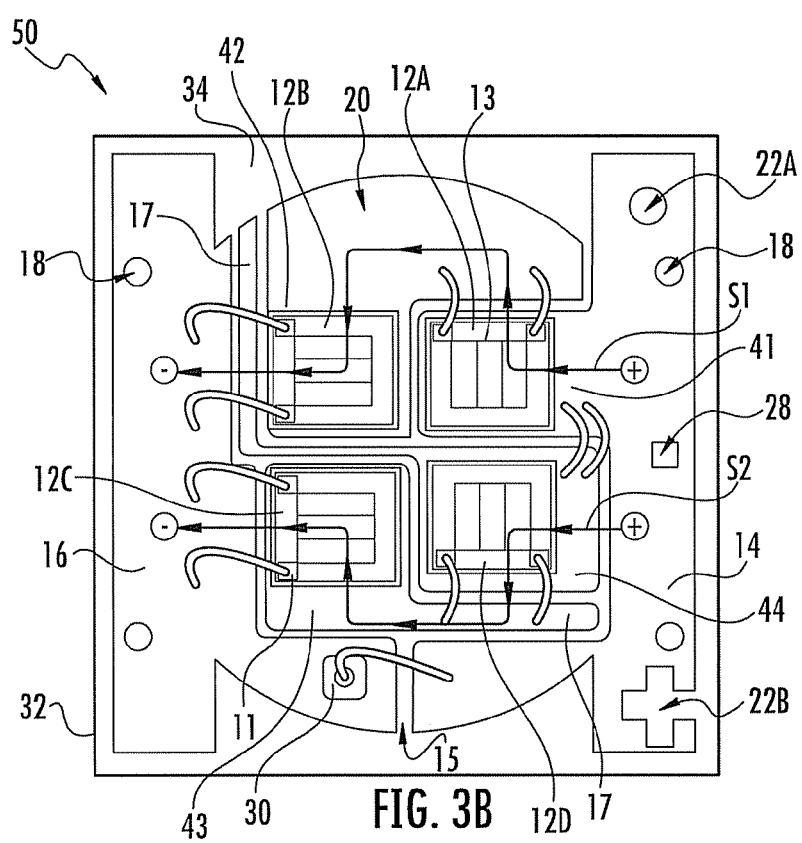

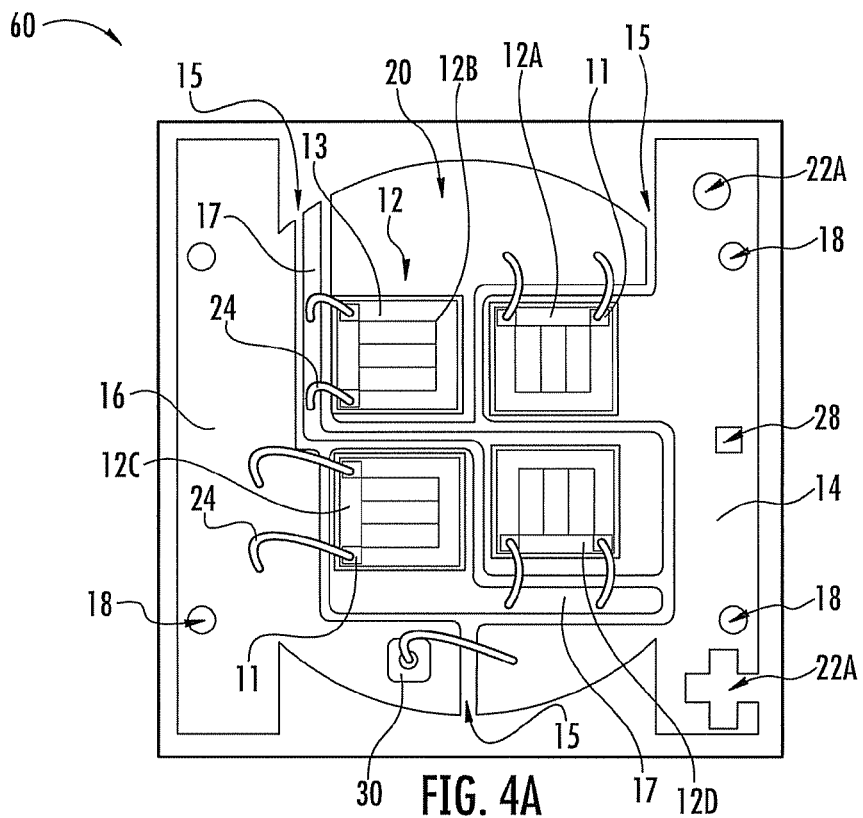
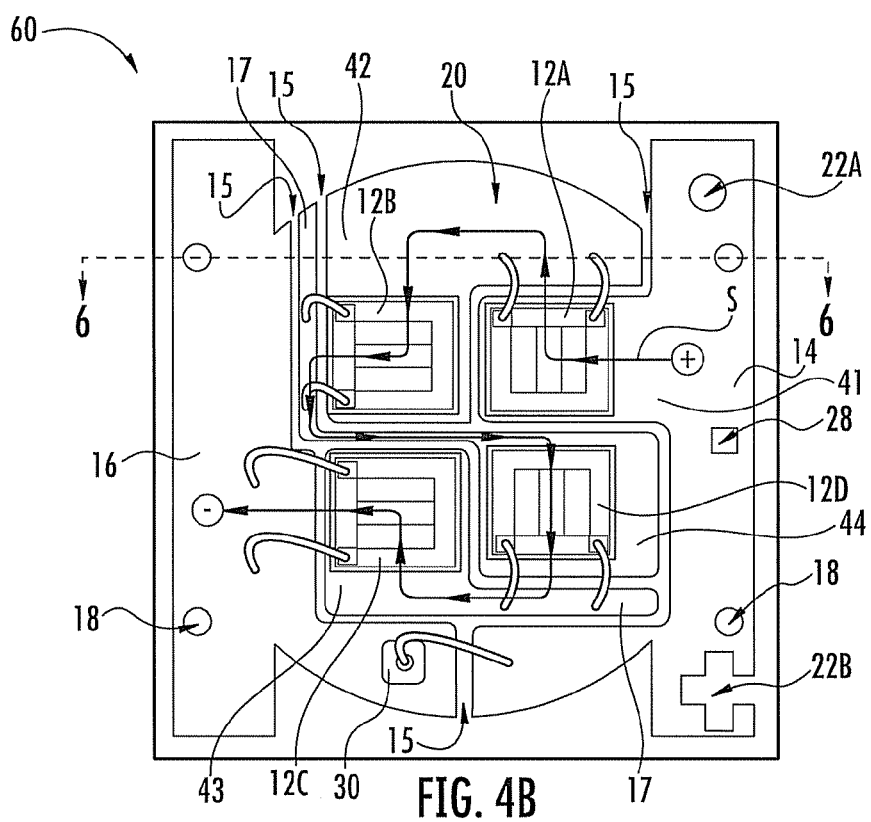

MULTIPLE CONFIGURATION LIGHT EMITTING DEVICES AND METHODS

CROSS REFERENCE TO RELATED APPLICATION

This application claims the benefit of and priority to U.S. Provisional Patent Application Ser. No. 61/390,966, filed Oct. 7, 2010, the disclosure of which is incorporated by reference herein in its entirety.

TECHNICAL FIELD

The subject matter disclosed herein relates generally to light emitting devices and methods. More particularly, the subject matter disclosed herein relates to multiple configuration light emitting devices and methods.

BACKGROUND

Light emitting devices, such as light emitting diodes (LEDs), may be utilized in packages or devices for providing white light (e.g., perceived as being white or near-white), and are developing as replacements for incandescent, fluorescent, and metal halide light products. A representative example of an LED lamp comprises a device having at least one LED chip, a portion of which can be coated with a phosphor such as, for example, yttrium aluminum garnet (YAG). The phosphor coating can convert light emitted from one or more LED chips into white light. For example, LED chips can emit light having desired wavelengths, and phosphor can in turn emit yellow fluorescence with a peak wavelength of about 550 nm for example. A viewer perceives the mixture of light emissions as white light. As an alternative to phosphor converted white light, light emitting devices of red, blue, and green (RGB) wavelengths can combine to produce light that is perceived as white. Conventional LEDs, devices and methods producing white light are typically designed for lower voltage or single voltage applications.

Despite availability of various LED chips and devices in the marketplace, a need remains for improved devices suitable for applications utilizing a range or variety of voltages. User configurable LEDs, systems, and methods advantageously offer users the ability to manipulate LED chips within a given device for use in applications operable at a variety of voltages while enhancing light output performance, thermal performance, improving device reliability, and promoting ease of manufacture.

SUMMARY

In accordance with this disclosure, multiple configuration light emitting devices and methods are provided that are well suited for a variety of applications, including industrial and commercial lighting products. It is, therefore, an object of the present disclosure herein to provide multiple configuration light emitting devices and methods comprising adjustable light devices while providing energy savings and requiring minimal maintenance.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 3A and 3B illustrate top views of an embodiment of an LED device according to the disclosure herein;

FIGS. 4A and 4B illustrate top views of an embodiment of an LED device according to the disclosure herein;

DETAILED DESCRIPTION

Figure 1A:
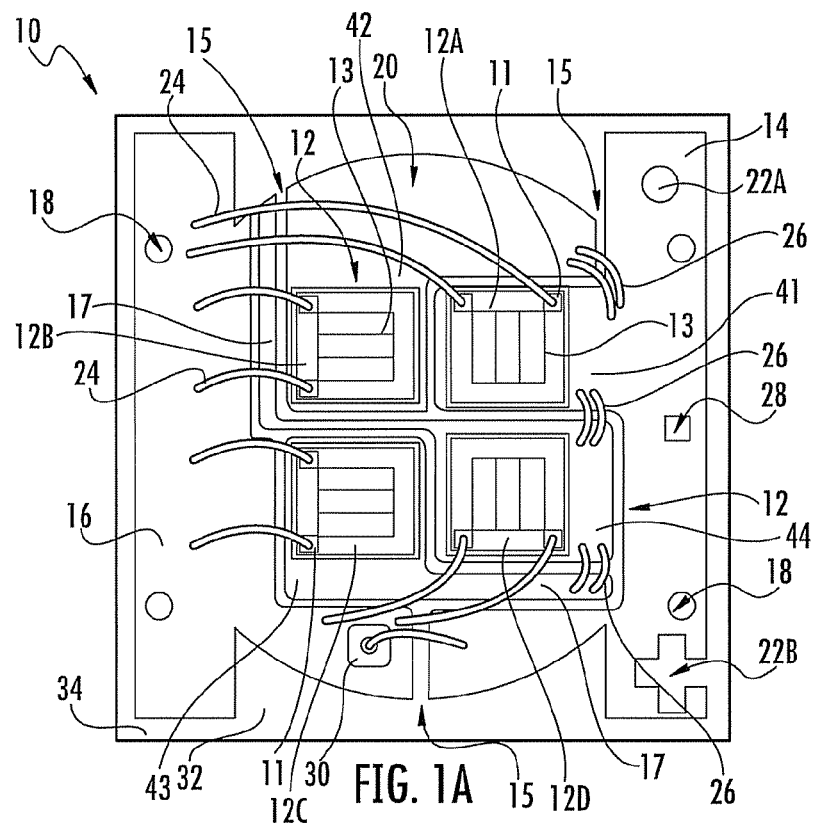
FIGS. 1A and 1B illustrate top views of an embodiment of a light emitting diode (LED) device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. Nos. Re. 34,861; 4,946,547; and 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as AlxGa1-xN where 1>x>0 are often used to describe these compounds. Techniques for epitaxial growth of Group III nitrides have become reasonably well developed and reported in the appropriate scientific literature, and in commonly assigned U.S. Pat. Nos. 5,210,051, 5,393,993, and 5,523,589, the disclosures of which are hereby incorporated by reference herein in their entireties.

Although various embodiments of LEDs disclosed herein comprise a substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

The LED can be coated, at least partially, with one or more phosphors with the phosphors absorbing at least a portion of the LED light and emitting a different wavelength of light such that the LED emits a combination of light from the LED and the phosphor. In one embodiment, the LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting.

Referring now to FIGS. 1A to 8B, embodiments of light emitting devices and methods are disclosed. FIGS. 1A to 3B illustrate multi-configurable devices and methods wherein one or more LEDs over a mounting pad 20 can be selectively configured into various arrangements depending upon the application and/or voltage range desired. For example, FIGS. 1A and 1B illustrate first embodiments comprising one or more LEDs or LED chips generally designated 12 configured in arrangements for use at lower voltages. In one aspect, first embodiments can comprise an arrangement can comprise LEDs suitable in devices and applications at approximately 3 volts (V). FIGS. 3A and 3B illustrate second embodiments comprising one or more LEDs configured in arrangements for use in applications requiring greater voltages than the first embodiment. In one aspect, second embodiment can comprise an arrangement of LEDs suitable in devices and applications at approximately 6V. Similarly, FIGS. 4A and 4B illustrate third embodiments comprising one or more LEDS configured in arrangements for use in applications requiring greater voltages than either of the first or second embodiments. In one aspect, the third embodiment can comprise LEDs suitable in devices and applications at approximately 12V. For illustration purposes, embodiments from 1A to 4B are shown, however, this is in no way limiting as multiple arrangements of one or more LEDs could be configured comprising vertical and/or horizontal devices, described earlier, to result in a multitude of suitable arrangements for desired applications.

Referring to FIGS. 1 to 8B in general, multi-configurable light emitting diode (LED) devices are illustrated. Such multi-configurable light emitting diodes can comprise a plurality of LEDs and the LEDs can be selectively configurable to be electrically connected in at least three different electrical configurations. In one aspect, multi-configurable devices, or packages can be useful when dealing with smaller package sizes, for example, packages having areas of 25 square millimeters ($mm^2$) or less, 12.25 $mm^2$ or less, or even 10 $mm^2$ or less.

Figure 1B:
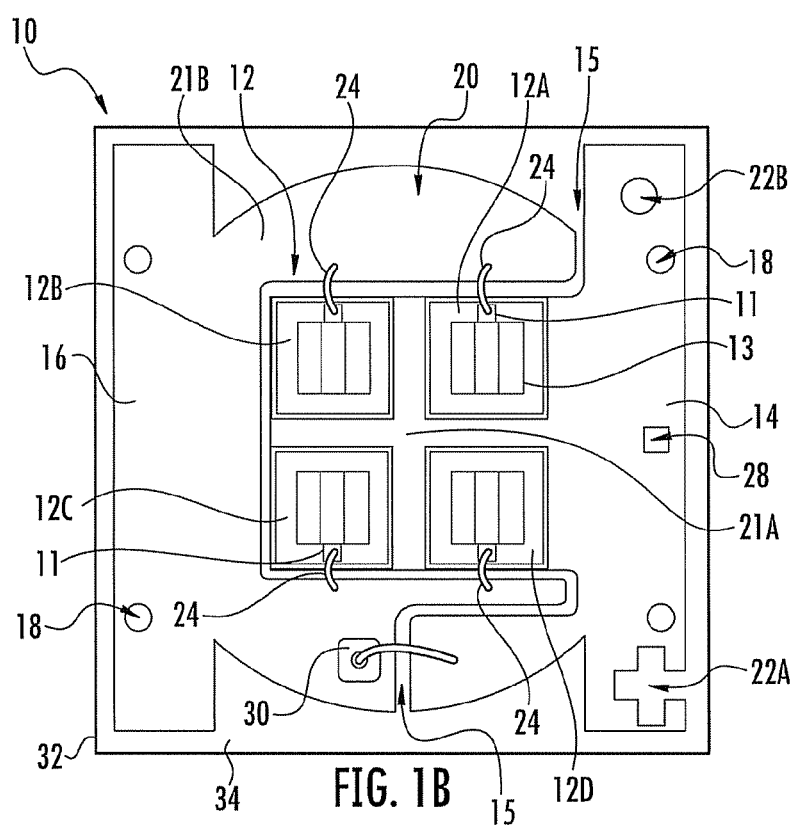

FIGS. 1A and 1B illustrate first embodiments of LED devices generally designated 10 according to the present subject matter. LED device 10 can comprise one or more LEDs chips 12 arranged over a mounting pad, generally designated 20. Mounting pad 20 can comprise any suitable electrically conductive material known in the art, for example, metallic materials, copper, aluminum, or conducting polymer materials. Mounting pad 20 can comprise one or more portions formed integral with or electrically and/or thermally isolated from electrical components of a LED device or system. For example, electrical components can comprise first and second electrical elements 14 and 16, respectively. First and second electrical elements 14 and 16 can comprise any suitable electrically conducting material known in the art, for example, metallic materials, copper (Cu), aluminum (Al), or conducting polymer materials.

In general, mounting pad 20 and first and second electrical elements 14 and 16 can be arranged and/or attached over a top surface 34 of a substrate or submount 32. LEDs 12 can comprise one or more LED chips having similar wavelengths of light, for example, comprising a certain targeted wavelength bin. In the alternative, LEDs 12 can comprise a plurality of LED chips wherein at least one of the LED chips 12 is a different targeted wavelength, for example, selected from a different targeted wavelength bin than another LED of the plurality. In one aspect, LEDs 12 selected for use can comprise wavelengths targeting cool white (CW) or warm white (WW) light upon, for example, mixing with light emitted from a phosphor as described earlier. In another aspect, LEDs 12 selected for use can comprise similar and/or different targeted wavelength bins including red, blue, green, amber, red-orange and/or a combination thereof. LEDs 12 can comprise a plurality of LEDs having a plurality of colors, for example, each LED 12 in the arrangement can be selected from a different targeted wavelength bin. For example, at least one LED 12 forming the plurality can comprise LEDs targeting each of red, green, blue, and/or white bins (RGBW) or red, green, blue, and/or amber bins (RGBA). Any suitable wavelength bin and/or phosphor combination can be selected depending upon the application and desired light emission.

In general, LEDs 12 can comprise many different semiconductor layers arranged in different ways. LED structures and their fabrication and operation are generally known in the art and are briefly discussed herein. LEDs 12 can comprise a conductive current spreading structure 13 and/or one or more wire bond pads 11 disposed on a top surface of LED 12. Current spreading structure 13 and bond pads 11 can comprise any suitable electrically conductive material, and can be deposited using any suitable method. Materials that can be used, for example, for current spreading structure 13 and bond pad 11 are gold (Au), copper (Cu), nickel (Ni), indium (In), aluminum (Al), silver (Ag), and/or combinations thereof, and metal alloys, conducting oxides and transparent conducting oxides. Current spreading structure 13 can comprise a grid having one or more conductive fingers spaced to enhance current spreading from the one or more bond pads 11 into the top surface of LED 12. During operation, an electrical signal or current can be applied to the bond pads 11 using, for example, a wire bond 24. The electrical signal or current can spread through the current spreading structure 13 and top surface into the LED 12. Current spreading structures 13 are often utilized in LEDs where the top surface is p-type, but can also be used for n-type materials.

LEDs 12 illustrated in FIGS. 1A to 8B can comprise a build wherein the bottom of the chip comprises an anode electrically communicating with first electrical element 14, and top bond pads 11 comprise a cathode electrically communicating with second electrical element 16. That is, electrical communication can comprise flowing electrical current from one electrical element, through the LEDs 12 and into the second electrical element 16. LEDs 12 are shown for illustration purposes, however, this embodiment is not limiting, any LED comprising any suitable build, size, shape, and/or type of LED known now or in the future can be utilized. First and second electrical elements 14 and 16 can provide electrically conductive paths for electrical communication with LEDs 12 using suitable or known attachment methods, for example, wire bonds 24 and/or solder attachment. For example, one or more LEDs 12 can mount over mounting pad 20, mounting pad 20 being formed integrally, and extending from, or separate and isolated from electrical elements 14 and 16, using any suitable method(s) and material(s), such as attachment using conventional solder techniques and materials. For example, attachment materials can comprise conductive epoxy, solder paste, preforms, flux eutectic materials or dispensed polymeric materials and methods of using the same, each of which can be electrically and thermally conductive.

Referring to FIGS. 1A to 8B in general, LED devices can comprise submount 32 which can comprise any suitable material. In one aspect, submount 32 can comprise an electrically insulating material. For example, materials can comprise, but are not limited to ceramic materials such as aluminum oxide, aluminum nitride or organic insulators like polyimide (Pl) and polyphthalamide (PPA). In other embodiments submount 32 can comprise a printed circuit board (PCB), sapphire or silicon or any other suitable material, such as T-Clad thermal clad insulated substrate material, available for example from The Bergquist Company of Chanhassen, Minn. For PCB embodiments, different PCB types can be used such as standard FR-4 PCB, metal core PCB, or any other type of printed circuit board. LED devices disclosed herein can be fabricated using methods utilizing a submount panel sized to accommodate a plurality of submounts. That is, multiple LED devices can be formed on the panel, wherein individual devices can be singulated from the panel. In various aspects, it may be desirable to have a submount 32 that is a good electrical insulator with low thermal resistance or high thermal conductivity (e.g., aluminum nitride). Some materials that may be used have a thermal conductivity of approximately 30 W/m·K or higher, such as zinc oxide (ZnO). Other acceptable materials have thermal conductivities of approximately 120 W/m·K or higher, such as aluminum nitride (AlN) which has a thermal conductivity that can range from 140-180 W/m·K. In terms of thermal resistance, some acceptable materials have a thermal resistance of 2° C./W or lower. Other materials may also be used that have thermal characteristics outside the ranges discussed herein.

Still referring to FIGS. 1-8B in general, submount 32 can comprise top surface 34 on or over which the patterned first and second electrical elements 14 and 16, respectively, as well as mounting pad 20 can be formed and arranged. The one or more LEDs 12 can mount approximate a center of the mounting pad 20. The size of the submount 32 in arrangements herein can vary depending on different factors, with one being the size of the LEDs 12. For example, the size of submount 32 in device 10, and other arrangements disclosed herein, can comprise essentially the same dimension as the effective heat spreading area in mounting pad 20 and first and second electrical elements 14 and 16, respectively. For example, in devices having four 1 mm LEDs, the submount 32 can measure approximately 5 mm by 5 mm. Also for example, in a device having four 0.7 mm chips, submount 32 can measure 3.5 mm by 3.5 mm. The 5 mm and 3.5 mm submount sizes are exemplary and not exhaustive. There can be more or less than 4 LEDs and the submount and devices can be smaller or larger than 700 µm or 1 mm, respectively. For example, a 2 mm×2 mm or 8 mm×8 mm submount is possible. This is assuming LEDs 12 comprise a generally square shape. However, any of the LEDs can also be rectangular. It is further understood that the submount can comprise any suitable shape including circular, rectangular or other multiple sided shapes.

The devices disclosed herein can further comprise elements to protect against damage from electrostatic discharge (ESD). In the embodiment shown the elements are on-chip, and different elements can be used such as various vertical silicon (Si) Zener diodes, different LEDs arranged in parallel and reverse biased to LEDs 12, surface mount varistors and lateral Si diodes. In the embodiments shown a Zener diode 30 can be utilized and mounted over mounting pad 20 using known mounting techniques. Diode 30 can be relatively small so that it does not cover an excessive area on the surface of the submount 32 or block a significant amount of light emitted from the LEDs 12. Diode 30 can also be positioned close to the edge of a lens 38 (FIGS. 8A/8B) such that it cannot block light from a center of the device.

FIGS. 1A and 1B illustrate first embodiment of device 10 comprising one or more LEDs 12, wherein at least one LED 12 is arranged in parallel with each of the other LEDs 12. FIGS. 1A and 1B differ in respect to the pattern of mounting pad 20 and the type of LEDs 12 used. For example, FIG. 1A illustrates mounting pad 20 having one or more portions separated by one or more gaps 15 as described and illustrated according to FIG. 2. LEDs 12 chosen for use in device 10 according to FIG. 1A can comprise two bond pads 11. In the alternative, device 10 according to FIG. 1B comprises LEDs 12 having one bond pad 11. FIG. 1A comprises four LEDs 12 each of which is mounted in parallel with respect to the other LEDs 12. The embodiments herein are not limited to four or any particular number of LEDs, but could comprise any number desired.

Figure 5:
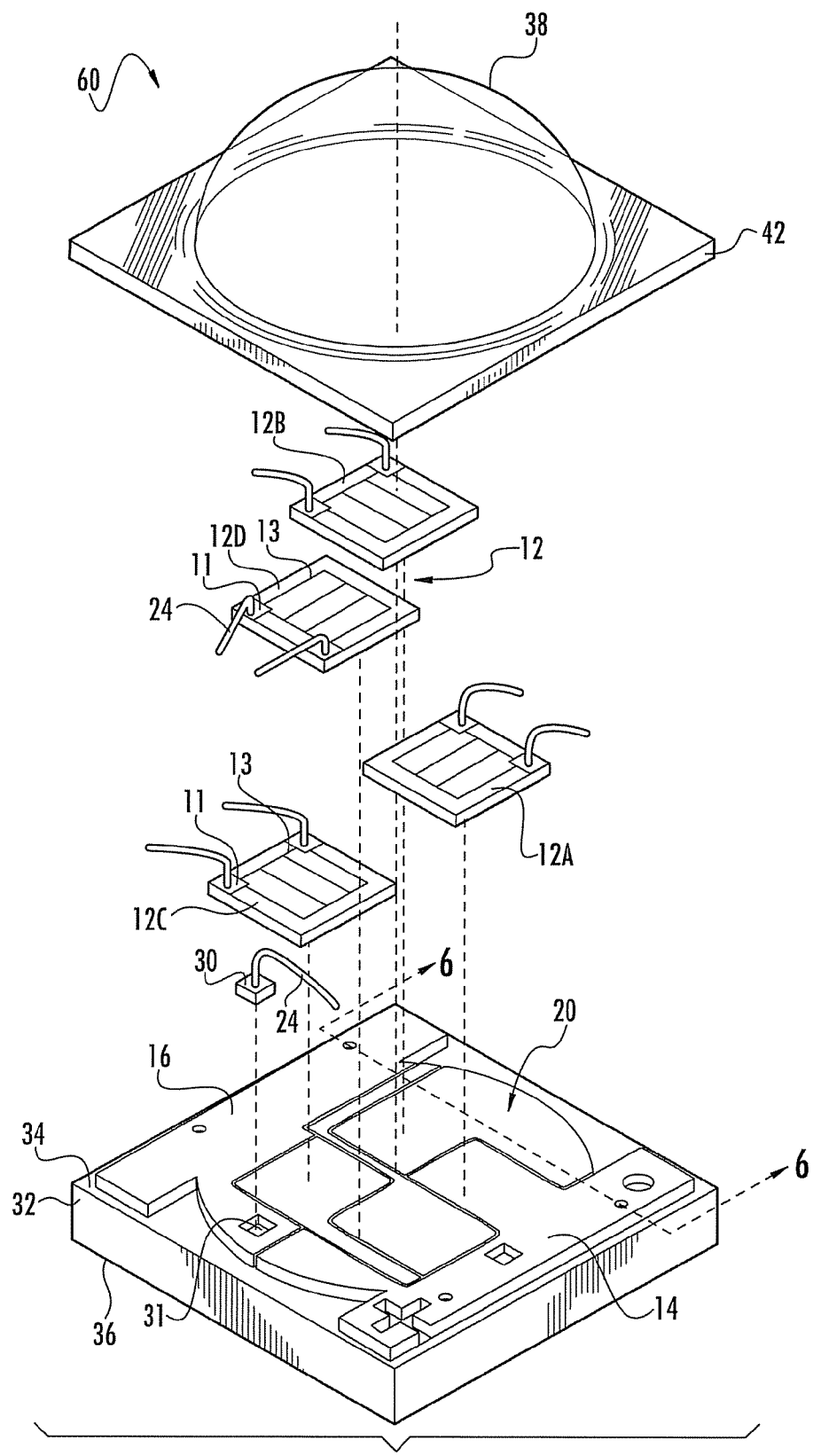
FIG. 5 illustrates an exploded view of an LED device according to the disclosure herein.
Figure 8A:
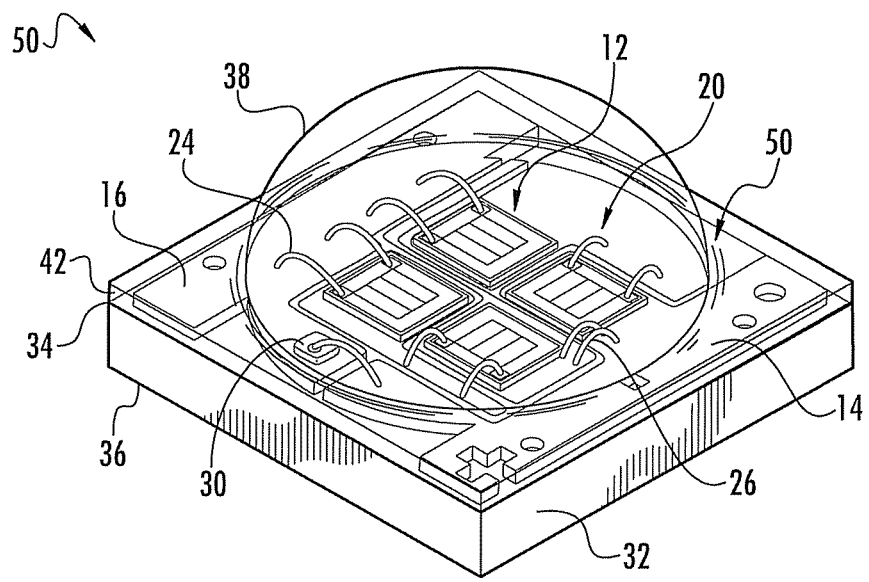
FIGS. 8A and 8B illustrate top perspective views of LED devices according to the disclosure herein.
Figure 8B:
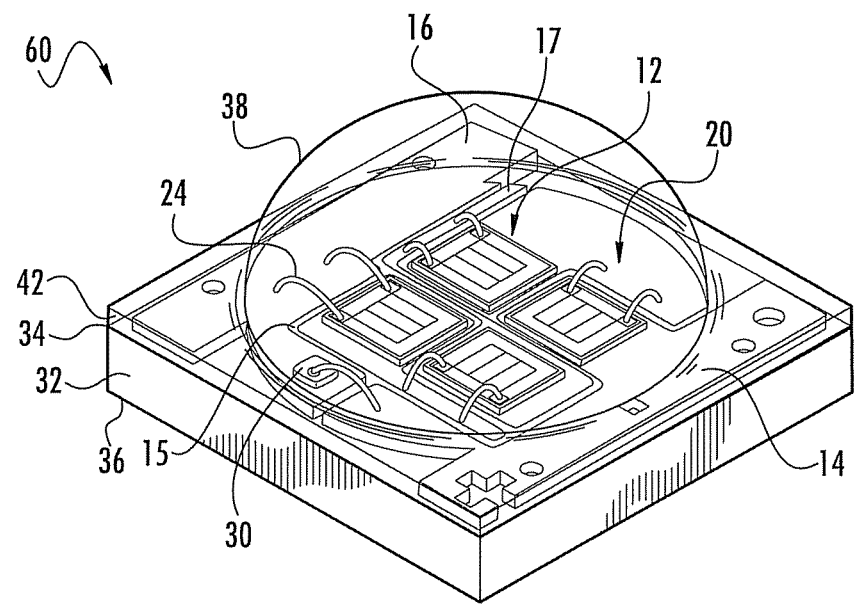

To connect in parallel, one or more portions of mounting pad 20 can electrically communicate, or link using one or more conductive wires 26 directly or indirectly to first electrical element 14 such that each LED 12 can be arranged over, or otherwise electrically communicate with, a positive electrode source such as first electrical element 14. LEDs 12 in FIGS. 1A and 1B can electrically communicate or connect directly or indirectly to each of first electrical element 14 and second electrical element 16. For example, FIG. 1A illustrates a first LED 12A electrical communicating or electrical connecting directly to first electrical element 14 using, for example, electrically conducting solder paste. First LED 12A can also be wirebonded directly to second electrical element 16 using wire bonds 24. A second LED 12B can be connected to a portion of mounting pad 20 which electrically communicates to first electrical element 14 using conductive wires 26. Thus, second LED 12B can be indirectly connected to first electrical element 14 and wirebonded directly to second electrical element 16. A third LED 12C can be mounted over a portion of mounting pad 20 which electrically communicates with first electrical element 14 using conductive wires 26. Third LED 12C also connects directly to second electrical element using wire bonds 24. Similarly, a fourth LED 12D can be mounted over a portion of mounting pad 20 which electrically communicates with first electrical element 14 using conductive wires 26. Fourth LED 12D can also be wirebonded to second electrical element 16. As each of LEDs 12A-12D is in electrical communication with each of first and second electrical elements 14 and 16, respectively, each respective LED 12A-12D is therefore in parallel with each of the other LEDs comprising the arrangement. Notably, the arrangement of LEDs in FIG. 1A comprises positioning the LEDs such that the bond pads 11 are facing the outer edges of submount 32 such that if a lens is used, any light blocked by the bond pads 11 and wire bonds 24 will be near the edge of the lens (as best illustrated in FIGS. 5, 8A, and 8B). Positioning chips such that the wire bonds 24 are near the outside allows maximum efficiency and light output per device or system. This allows for tighter packing of LEDs 12 which in turn produces a tighter point source and optimized light output.

FIG. 1B illustrates first device 10 which is an alternative to that of FIG. 1A. In FIG. 1B, each LED 12 is still in parallel with each of the other LEDs 12 just as the embodiment of FIG. 1A. FIG. 1B comprises an arrangement of LEDs 12 each having a single bond pad 11. FIG. 1B illustrates mounting pad 20 comprising a first portion 21A and a second portion 21B. First and second portions 21A and 21B can be integrally formed with respective first and second electrical elements 14 and 16. Mounting pad 20 in FIG. 1B comprises first portion 21A formed integral with first electrical element 14 wherein it is electrically and/or thermally isolated from second electrical element 16 by a single gap 15. In FIG. 1B, gap 15 forms a trench, or path, about the four LEDs 12. Each of the LEDs 12 can be positioned over mounting pad 20 in direct electrical communication with first electrical element 14. Each of the LEDs, that is LEDs 12A to 12D can also electrically communicate directly with second electrical element 16 using wire bonds 24 which allows current to flow from the LED bond pads 11 to the second electrical element 16. Similar to that shown in FIG. 1A, the LEDs 12 of FIG. 1B can be rotated and/or positioned such that the bond pads 11 are located radially with respect to a center of the four LEDs 12 and along the outer edges of the four LEDs 12, towards the outer edges of the substrate, for minimizing light blocked by wire bonds 24. This arrangement allows a tightly packed configuration producing a smaller point source and optimizes light output. FIGS. 1A and 1B comprise LEDs 12 connected in parallel, thus the overall systems or arrangements within device 10 are operable at lower voltages. In one aspect, the arrangements comprising device 10 can be operable at approximately 3V at 350 ma. Lower voltages are also possible, with the voltage a function of the chip voltage, device operating temperature, and drive current. The arrangements herein can be user configurable for use at higher voltage applications, for example, by changing the position and/or placement of wire bonds 24 connecting the LEDs in parallel and/or series. Other configurations are shown in FIGS. 3A to 4B, and these are in no way limiting, as the number and configuration of LEDs 12 can be unlimited.

Figure 2:
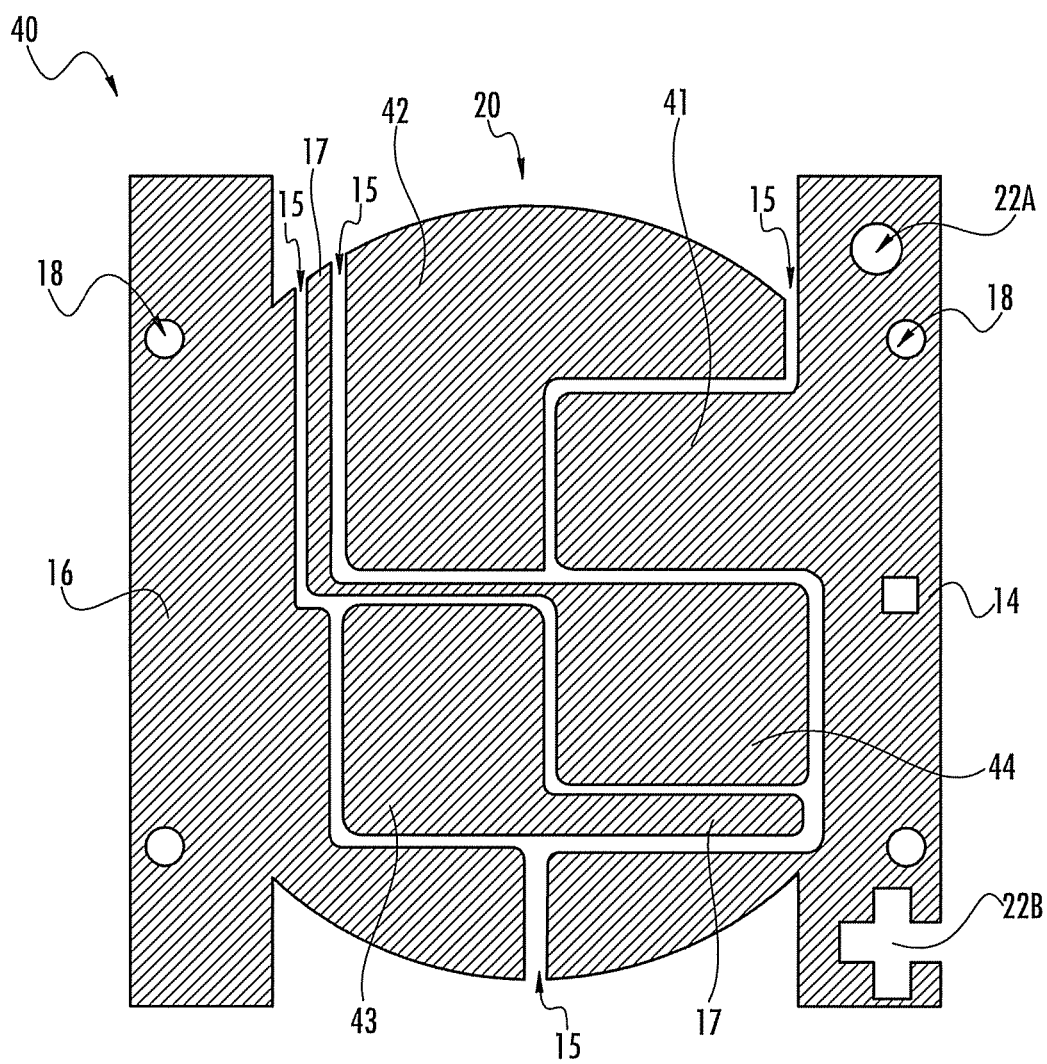
FIG. 2 illustrates a top view of a conductive pattern according to the disclosure herein.
Figure 6:
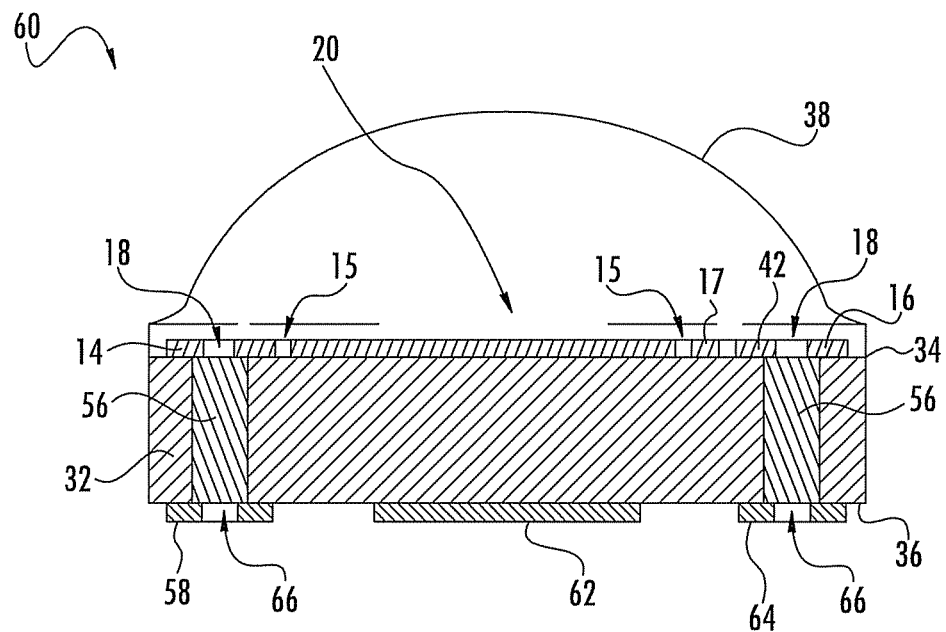
FIG. 6 illustrates a cross-sectional view of LED devices according to the disclosure herein.

FIG. 2 illustrates conductive pattern 40. Conductive pattern 40 can also be utilized by the configurations or arrangements of LEDs within devices 50 and 60 as illustrated in FIGS. 1A and 3A to 8B. Conductive pattern 40 can comprise mounting pad generally designated 20 and first and second electrical elements 14 and 16. Conductive pattern 40 can mount over submount 32 wherein alignment can be facilitated by alignment holes 18 which will communicate to one or more internal conductive vias 56 (FIG. 6). Mounting pad 20 can comprise one or more portions defined by one or more gaps 15. The portions of mounting pad 20 can be electrically and/or thermally isolated from each of the other portions. The portions of mounting pad 20 can be selectively configurable such that the portions can selectively electrically communicate with each other using one or more conductive wires to link the portions together. Portions of mounting pad 20 can optionally be electrically and/or thermally isolated from each of first and second electrical elements 14 and 16 unless connected by one or more conductive wires 26, as best illustrated by FIGS. 1A, 3A, and 3B. In one aspect, one or more portions of mounting pad 20 can be formed integral with either of first and/or second electrical elements 14 and 16, respectively. For example, FIG. 2 illustrates mounting pad 20 comprising a first portion 41, a second portion 42, a third portion 43, and a fourth portion 44 in a counterclockwise arrangement. Portions 41-44 can form a substantially tightly packed square arrangement having a center.

Notably, each of portions 41-44 can but are not required to be electrically conductive. Each of portions 41-44 can comprise electrically non-conductive materials such as ceramics. In one aspect, portions 41-44 can comprise aluminum nitride (AlN) materials or substrates. In one aspect, LEDs 12 can be directly mounted over submount 32. Similarly, first portion 41 can but is not necessarily formed integral with electrical element 14 and can be electrically and/or thermally isolated from the remaining portions 42-44 by one or more gaps 15. Similarly, portions 42-44 can be electrically and/or thermally isolated from each other portion as well as electrical elements 14 and 16 by one or more gaps 15. The sizes and shapes of the portions are defined by gaps 15 and are in no way limited to the sizes and shapes shown. Any suitable size and/or shape could be used. The number of portions and arrangement is in no way limited to FIG. 2, but rather for illustration purposes, four portions are shown.

Still referring to FIG. 2, one or more portions 41-44 may contain projecting portions 17 located between one or more gaps 15. Portions 41-44 and projecting portions 17 enable user configurable systems in which placement and/or electrical connections of one or more LEDs 12 can be varied. This can be advantageous by allowing one device to accommodate multiple applications covering a range of Vf and other desired properties. In one aspect, devices employing conductive patterns such as illustrated in FIG. 2 can be operable at a range of 3 volts (V) to 12 V depending on how the user configures the arrangement of LEDs and portions of mounting pad 20. FIG. 2 illustrates third and fourth portions 43 and 44, respectively, comprising projecting portions 17. For example, fourth portion 44 of mounting pad 20 comprises an L-shaped projection portion 17 disposed between two gaps 15. L-shaped projection portion 17 at least partially parallels second electrical element 16 and then at least partially extends orthogonally and inwardly towards the center of mounting pad 20. Third portion 43 of mounting pad 20 comprises a projecting portion 17 orthogonal first electrical element 14 and extending towards first electrical element 14.

Figure 7:
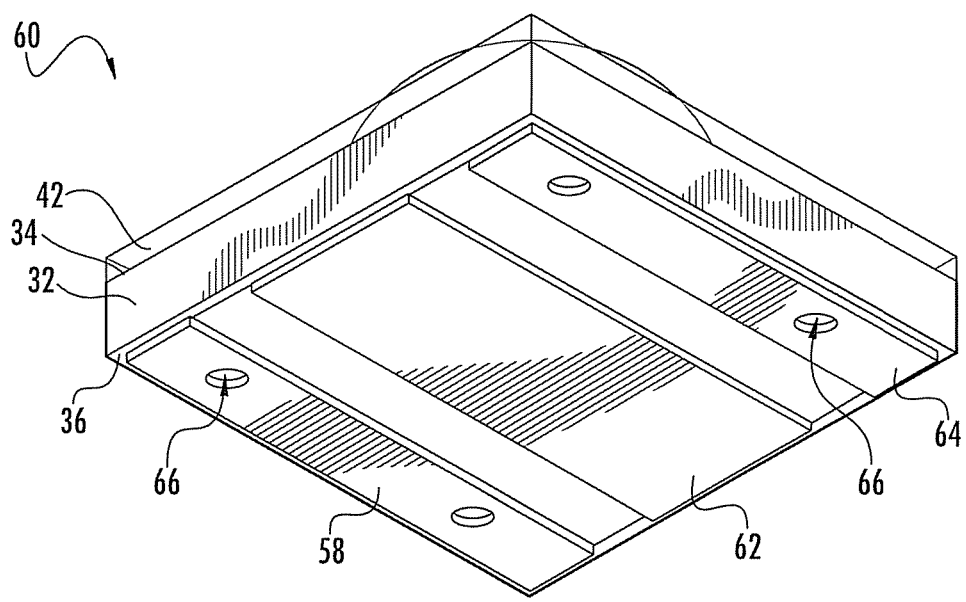
FIG. 7 illustrates a bottom perspective view of LED devices according to the disclosure herein.

Still referring to FIG. 2, but also illustrated in additional figures, first electrical element 14 can comprise one or more symbols or indicators 22A and 22B to indicate electrical polarity which can be important for electrical communication of the device elements to LEDs 12 and device elements to an external source. For example, a bottom surface of LED 12 can couple or electrically connect to a plus of the electrical signal denoted by indicator 22B, while bond pads 11 can electrically connect to second electrical element 16. Similarly, to ensure accurate mounting of LED devices over an external, source such as a PCB or other substrate, a first mounting pad 58 (FIG. 7) in electrical communication with first electrical element 14 can be mounted over a positive side of a signal to drive current through the LEDs. In the example shown, indicator 22B comprises a plus (+) sign over the first electrical element 14 indicating that the arrangement should be mounted with the positive of the signal coupled to a first mounting pad 58. The minus of the signal would then be coupled to a second mounting pad 64 (FIG. 7). Indicator 22A can comprise an alignment marker used during fabrication of the electrical elements to ensure adequate alignment of, for example, mask during deposition. It is understood that many different symbol and indicator types can be used and that a symbol can also be included over second electrical element 16. It is also understood that the symbols can be placed in other locations other than the electrical elements.

Still referring to FIG. 2, mounting pad 20 and first and second electrical elements 14 and 16 can comprise any suitable electrically and/or thermally conducting material. In one aspect, mounting pad 20 and first and second electrical elements 14 and 16 can comprise copper deposited using known techniques such as plating. In typical plating processes, a titanium adhesion layer and copper seed layer are sequentially sputtered onto a substrate. Then, approximately 75 microns of copper can be plated onto the copper seed layer. The resulting copper layer being deposited can then be patterned using standard lithographic processes. In other embodiments the layer can be sputtered using a mask to form the desired pattern. In other aspects, the conductive materials used for mounting pad 20 and electrical elements 14 and 16 may each comprise copper or one of the features can be copper and the other features can comprise one or more different material(s). For example, mounting pad 20 can be plated or coated with additional metals or materials to the make mounting pad 20 more suitable for mounting LEDs 12. For example, the mounting pad 20 can be plated with adhesive or bonding materials, or reflective and barrier layers.

One or more gaps 15 can be disposed through the mounting pad 20 and/or between mounting pad 20 and first and second electrical elements 14 and 16, respectively. Gaps 15 can extend down to the top surface 34 of submount 32 thereby electrically and thermally isolating electrical elements 14 and 16 and one or more portions 41-44 of mounting pad 20. As described in more depth below, an electrical signal can be applied directly or indirectly to LEDs 12 from the first electrical element 14 facilitated by the mounting pad 20. A signal can directly pass for example, when first portion of mounting pad 41 is formed integrally with electrical element 14, with no gap formed between. A signal can indirectly pass to a LED when portions (42 to 44) of mounting pads are linked to electrical element 14 using one or more conductive wires 26, as seen best in FIGS. 1A and 3A. The electrical signal can pass through the LEDs 12 to the second electrical element 16 using one or more wire bonds 24 connecting bond pads 11 to second electrical element 16. Gaps 15 can provide electrical isolation between the first and second electrical elements 14 and 16 to prevent shorting of the signal applied to the LEDs 12.

Conductive pattern 40 illustrated in FIG. 2 and also illustrated in FIGS. 1A to 8B can be mounted over submount 32. Heat generated by the one or more LEDs 12 typically may not spread efficiently into submount 32, particularly a submount comprising ceramic materials. When LEDs 12 are provided over mounting pad 20, heat does not spread through most of the submount, but rather can become generally concentrated to the area just below the LED 12. This can cause overheating of LEDs 12 which can in turn limit the operating power level for the LED device. To improve heat dissipation of LED devices, for example devices 50 and 60, mounting pad 20 and electrical elements 14 and 16 can provide extending thermally conductive paths to laterally conduct heat away from the LEDs 12 such that it can spread to other areas of submount 32 beyond the areas just below the LEDs 12. For example, mounting pad 20 can cover more surface area of the top surface 34 of submount 32 than that covered by the LEDs 12. Mounting pad 20 can extend towards the edges of submount 32. In the embodiment shown, mounting pad 20 is generally circular and extends radially from the LEDs 12 toward the edges of submount 32. A portion of mounting pad 20 intersects with first electrical element while remaining isolated from the second electrical element 16. It is understood that mounting pad 20 can comprise any suitable shape and/or size and that in some embodiments it can extend to the edge of the submount 32.

Referring to FIGS. 1A to 8B in general, first and second electrical elements 14 and 16 can cover portions of top surface 34 of submount 32 extending out from alignment holes 18 and covering the area between alignment holes 18 and edges of submount 32. By extending electrical elements 14 and 16 this way, the heat spreading from LEDs 12 can be further improved. This improves thermal dissipation of heat generated in LEDs 12, which improves its operating life and allows for higher operating power. Mounting pad 20 and electrical elements 14 and 16 can cover different percentages of top surface 34 of submount 32, with a typical coverage area being greater than 50%. In one aspect, mounting pad 20 and electrical elements 14 and 16 can cover approximately 70% of the submount. In other aspects, the coverage area can be greater than 75%.

FIGS. 3A to 4B illustrate second and third embodiments of devices and arrangements of LEDs 50 and 60 according to the subject matter herein. FIGS. 3A to 4B illustrate arrangements of LEDs comprising at least one group of LEDs, wherein a first LED of the group is electrically connected in series with another LED of the group. The arrangements of LEDs described herein can be selectively configured by a user to create devices operable at 3 V or greater than 3V. Devices 50 and 60 comprise similar features to those of LED device 10. For similar features, the same reference numbers are used with the understanding that the description above applies equally to these embodiments. For example, LED devices 50 and 60 can comprise conductive pattern 40 having mounting pad, generally designated 20, and first and second electrical elements 14 and 16 mounted over submount 32. Devices can further comprise one or more LEDs 12 and a lens 38 (FIGS. 8A/8B). Similar to LED device 10, LED devices 50 and 60 can be arranged for surface mounting over an external source. The devices can be user configurable thereby having variable arrangements and/or placement of LEDs 12, wire bonds 24, and conductive wires 26 over numerous mounting pad 20 accommodate, for example, devices operable in a variety of low to high voltage applications. Devices 50 and 60 can operate at higher voltages which can be accomplished in part by varying the arrangement, or electrical configuration, of LED chips 12 within the device to connect at least a first LED 12 in series with a second LED 12. That is, a higher power source can be used with LEDs, LED devices, and methods as voltage will be divided across the series of one or more LED chips 12. The higher voltage generated by the power source can comprise a series of respective lower voltages passing through each individual LED chip 12. The power source voltage can operate in a range from 3 to 12 V for some applications, and in other applications it may be desirable to operate at greater than 12 V.

FIGS. 3A to 3B illustrate LED device 50. This device comprises a device in which a user has configured the LEDs and wire bonds 24 in a different arrangement from those of device 10 and 60. This arrangement is not limiting but is disclosed for illustration purposes. It is understood that arrangements can comprise multiple LEDs arranged over portions of mounting pads 20, and/or placement of wire bonds 24 and conductive wires 26. FIG. 3A illustrates an arrangement of four LEDs 12A-12D electrically connected to each other in a combination of series and parallel. For example, FIG. 3A illustrates a first LED 12A arranged in series with a second LED chip 12B. This arrangement illustrates first group of LEDs comprising first and second LEDs 12A and 12B, respectively. The first group is disposed opposite and is structurally located parallel second group. The first group of LEDs can be connected in parallel to second group of LEDs using conductive wires 26 to connect, for example, first portion 41 of mounting pad to fourth portion 44 of mounting pad. Fourth portion 44 of mounting pad opposes first portion 41 of the mounting pad wherein gap 15 is disposed therebetween. A second group of LEDs can comprise third LED 12C connected in series with fourth LED 12D. Thus, the arrangement of LEDs within device 50 comprises a combination of LEDs 12 electrically connected both in series and parallel.

FIG. 3B illustrates current flow of first and second series S1 and S2, respectively. As illustrated, first series S1 is connected in parallel with second series S2 by positioning conductive wires 26 electrically connecting first portion 41 in parallel with fourth portion 44 of mounting pad. First series S1 comprises first group of LEDs 12 and an electrical signal or current which can flow along a designated path defined by wire bonds 24 and conductive wires 26 over one or more portions 41-44 of mounting pad 20. First series S1 comprises an electrical signal passing from an external source to first electrical element 14 and then into first LED 12A. When electrical signal passes through first LED 12A, it can cause light emission of a desired wavelength. The electrical signal of first series S1 can pass out of first LED 12A and into second portion 42 of mounting pad 20. Current from first series S1 can then pass into second LED 12B and out from the LED bond pads 11 and then into second electrical element 16. The current can pass through the device by one or more conductive vias 56 into surface mount pad 58 (FIG. 6) and to an external circuit or source.

Similarly, second series S2 comprises a second group of LEDs 12 and an electrical signal or current which can flow along a designated path defined by wire bonds 24 and conductive wires 26 over one or more portions of mounting pad 20. Second series S2 comprises an electrical signal generated externally and passing from first electrical element 14 into fourth LED 12D. This can be accomplished, for example, by connecting fourth portion 44 to first portion 41 using one or more conductive wires 26. When electrical signal passes through fourth LED 12D, the electrical signal can cause light emission of a desired wavelength. The electrical signal of second series S1 can pass out of fourth LED 12D and into projection portion 17 of third portion 43 of mounting pad 20. Current from second series S2 can then pass into third LED 12C and out of the LED bond pads 11 into the second electrical element 16 to an external source. Notably, bond pads 11 of each of LEDs 12A-12D can be positioned radially outwards toward the edges of submount 32 to minimize an amount of light blocked and to allow a tighter point source of light emitted from the groups of LEDs. LEDs 12 can be in a substantially square arrangement. The electrical signals, or current, of first series S1 can be connected in parallel to second series S2 by one or more conductive wires 26 which electrically couples first portion 41 of mounting pad 20 to fourth portion 44 of mounting pad. The conductive path flows along two parallel lines indicated by first and second series S1 and S2. Connecting two series in parallel allows LED device 50 to be configured into an arrangement suitable for use at higher voltages. In one aspect, LED device 50 is suitable for use at approximately 6 V. Any suitable and desired number of LEDs 12 can be connected in series. Likewise, any number of series can be connected in parallel to achieve a device operable as a desired power and voltage application. The design is not limited to the design shown in FIGS. 3A to 3B, but for illustration purposes two series S1 and S2 are shown connected in parallel.

As an example and without limitation, LED devices according to the example provided by LED device 50 can comprise four 1 mm chips and can exhibit a range of luminous flux comprising approximately 129 to 140 lumens (lm) at a drive current of 175 mA (1 W equivalent). The median and/or average luminous flux can for example be approximately 135 lm/W at 175 mA. The average Vf can for example be approximately 5 V at 175 mA, and a range of luminous flux can be approximately 248 to 264 lm at a drive current of 350 mA (2 W equivalent). The median and/or average luminous flux can be approximately 255 lm at 350 mA, and the average Vf can be approximately 5.1 V at 350 mA. A range of luminous flux can be approximately 450 to 475 lm at a drive current of 700 mA (4 W equivalent). The median and/or average luminous flux can be approximately 462 lm at 700 mA. The average Vf can be approximately 5.5 V at 700 mA. Thus, LED device 50 can be configured and operable at a range of Vf, such as for example 4V to 8 V.

FIGS. 4A to 4B illustrate LED device 60. This device comprises a device in which a user has configured the LEDs and wire bonds 24 in a different arrangement from those of device 10 and 50. This arrangement is not limiting but used for illustration purposes, as arrangements can comprise multiple LEDs, portions of mounting pads 20 defined by one or more gaps 15, and/or placement of wire bonds 24 and conductive wires 26. Similar to those illustrated in FIGS. 1A and 3A, LED device 60 can comprises four LEDs 12A to 12D mounted over portions of mounting pad 41 to 44, respectively. Device 60 has been configured such that each of LEDs 12A to 12D can be connected in series. When compared to FIGS. 3A and 3B, this arrangement can differ, for example, by wire bond 24 placement and lack of conductive wires 26 connecting portions of mounting pad. For example, wire bonds 24 extending from second LED 12B in FIGS. 4A and 4B does not extend or "jump" over projecting portion 17 of fourth portion 44 of mounting surface, but rather electrically connects to projection portion 17. In addition, FIGS. 3A and 3B include one or more conductive wires 26 connecting LEDs 12 of one or more portions of mounting pad 20 in parallel. As FIGS. 4A and 4B illustrate four LEDs 12A-12D connected in series, there is no need to connect portions of mounting pad using conductive wires.

FIG. 4B illustrates current flow of series S wherein four LEDs can be connected in series. Series S comprises a first group of four LEDs 12A-12D connected in series having electrical signal or electric current which can flow along a designated path defined by wire bonds 24 over one or more portions 41-44 of mounting pad 20. Series S comprises an electrical signal passing from first electrical element 14 into first LED 12A. When current or electrical signal passes through the LEDs 12A-12B, the electrical signal will cause light emission of a desired wavelength. The electrical signal of series S can pass out of first LED 12A and into second portion 42 of mounting pad 20. Current from series S can then pass into second LED 12B and out of the LED bond pads 11 into projecting portion 17 of fourth portion 44 of mounting pad 20. Current of series S can then flow along the projection portion 17 and into fourth LED 12D and out from the bond pads 11 of fourth LED 12D onto projection portion 17 of third portion 43 of mounting pad 20. Current from series S can then pass into third LED 12C and out from the bond pads 11 of the LED into the second electrical element 16. Current therefore travels through four LEDs 12A to 12D and series S comprises LEDs 12 connected in an essentially "S" shape. That is, current does not flow consecutively clockwise or counterclockwise about the substantially packed square shape of the LEDs, but rather travels from 12A to 12B to 12D and lastly to 12C along an "S" shaped configuration. This configuration enables devices to be operable at higher voltages than devices 10 and 50. This is because connecting in series allows the LEDs to be driven at a higher current as the current is divided among the LEDs. Devices adopting this arrangement may be operable at 12 V or greater. Again, with respect to devices 10, 50, and 60, and for illustration purposes, four LEDs 12 are shown mounted over four portions of mounting pad 20. Devices comprising more or less than four LEDs mounted over more or less than four portions of mounting pad and connected in series, parallel and/or a combination thereof are possible and hereby contemplated.

FIG. 5 illustrates an exploded view of various components comprising, for example, LED device 60 further comprising lens 38 and protective layer 42. It is noted that LED devices 10 and 50 can also comprise lens 38 and protective layer 42, but for illustration purposes device 60 is shown. Mounting pad 20 and electrical elements 14 and 16 can be arranged over top surface 34 of submount 32. Mounting pad 20 can comprise an opening 31 for the ESD device, for example, Zener diode 30 such that it can be mounted over mounting pad 20. Different mounting materials and methods can be used such as those used to mount the LED 12 over mounting pad 20. Wire bond 24 can extend over gap 15 and connect the second electrical element 16 to first electrical element 14 using Zener diode 30 as the connection source. Diode 30 can be biased opposite of LED chips 12. The arrangement of LED 12 and diode 30 allows excessive voltage and/or current passing through LED device 60 from an ESD event to pass through diode 30 instead of LEDs 12 thereby protecting LEDs 12 from damage. Wire bonds 24 and conductive wires 26, where applicable, can be configured using methods known now or in the future and can comprise known conductive materials. For example, a suitable material can comprise gold (Au). It is understood that in some aspects, LED devices 10, 50, and 60 can be provided without an ESD element/diode or, in an alternative, an ESD element/diode can be located external to the LED device(s).

FIG. 5 also illustrates LED device comprising at least one solder dam 28 disposed in an area around LEDs 12. Solder dams 28 can help center the LEDs 12 and reduce movement of the LEDs while the mounting solder is in liquid form. When the liquid solder encounters any one of the dams, movement is slowed or stopped. This helps reduce the movement of the LED until the solder hardens. Solder dams 28 also provide a reservoir wherein excess solder can flow and become trapped such that it does not extend into one or more gaps and electrically short one or more electrically isolated portions 42-44 of the mounting pad 20.

An optional feature or step which can be included is using a solder mask (not shown) comprising conventional materials which can be included over conductive pattern 40 and top surface 34 of submount 32. This feature is described in U.S. patent application Ser. No. 12/757,891, the entirety of which is incorporated by reference herein. Solder mask can at least partially cover mounting pad 20, first and second electrical elements 14 and 16, and one or more gaps 15. Solder mask can protect these features during subsequent processing steps and in particular mounting LEDs 12 to mounting pad 20 and wire bonding. During these steps there can be a danger of solder or other materials depositing in undesired areas, which can result in damage to the areas or result in electrical shorting. The solder mask can provide an insulating and protective material that can reduce or prevent these dangers. The solder mask can comprise an opening for mounting LEDs 12 over mounting pad 20 and for attaching wire bonds 24 to second electrical element 16. It can also comprise side openings allowing convenient electrical access to electrical elements 14 and 16 for testing the devices during fabrication. Solder mask can have alignment holes, similar to holes 18 of electrical elements 14 and 16 that can provide for alignment during fabrication of the LED devices and also allow for alignment when mounted in place by the end user.

FIG. 6 illustrates a cross-sectional view of LED device 60. This view is also representative of devices 10 and 50. In this view, surface mount pads 58 and 64 can be seen disposed essentially vertically below first and second electrical elements 14 and 16, respectively. A current or electrical signal can be applied to the device through surface mount pads 58 and 60 from an external source (not shown) when device mounts over external source. For example, first and second surface mount pads 58 and 60 can electrically communicate to solder contacts or other conductive paths located on an external source, and pass current into first and second electrical elements 14 and 16, respectively. An external source can comprise a printed circuit board PCB, metal core printed circuit board (MCPCB) or any other suitable external source capable of passing current. In the embodiment shown, LED device 60 can be arranged for mounting using surface mount technology and device 60 comprises internal conductive paths defined by one or more conductive vias 56. Device 60 can comprise first and second surface mount pads 58 and 64 formed on bottom surface 36 of submount 32 and at least partially in alignment with first and second electrical elements 14 and 16, respectfully.

One or more conductive vias 56 can extend through submount 32 between first surface mount pad 58 and first electrical element 14 such that when a signal is applied to the first surface mount pad 58 it is conducted through submount 32 and into first electrical element 14. Similarly, one or more conductive vias 56 can be formed extending between second surface mount pad 64 second electrical element 16 to conduct an electrical signal between the two. Conductive vias 56 can extend between alignment holes 18 and bottom alignment holes 66 of respective surface mount pads and electrical elements. First and second surface mount pads 58 and 64 can allow for surface mounting of the LED device with the electrical signal to be applied to LEDs 12 across the first and second mounting pads 58 and 64. Conductive vias 56 and surface mount pads 58 and 64 can comprise any suitably electrically conducting material and can be applied using any suitable technique, including techniques used for mounting pad 20 and first and second electrical elements 14 and 16. It is understood that surface mount pads 58 and 64 and conductive vias 56 can be arranged in many different configurations, and can therefore comprise any suitable shapes and/or size. As conductive vias 56 connect electrical elements to respective surface mount pads, it is also understood that electrical elements may be positioned in other arrangements, including isolated adjacent arrangements in addition to the arrangement illustrated. Conductive vias 56 can form between respective surface mount pads and electrical elements which may not be substantially vertically arranged, but could be arranged at an angle within submount 32. It is also understood that instead of vias, one or more intervening metal layers can be provided between one or more surfaces of the submount between the surface mount pads and electrical elements, or even along external side surfaces of submount 32 between respective surface mount pads and electrical elements.

FIG. 7 illustrates a bottom view of LED device 60. This view can be that of devices 10 and 50 as well. LED device 60 can further comprise a thermal element 62 disposed over bottom surface 36 of submount 32. Thermal element 65 can optionally be disposed between first and second mounting pads 58 and 64, respectively. In one aspect, thermal element 62 is disposed in a central location of submount 32 below the one or more LEDs 12. Thermal element 62 can comprise any thermally conductive material known now or in the future and can be in at least partial vertical alignment with the LEDs 12. In one embodiment, thermal element 62 is electrically isolated from electrical elements 14 and 16 on top surface 34 of submount 32 as well as first and second surface mount pads 58 and 64 on bottom surface 36 of submount 32. Although heat from LEDs 12 can laterally spread over top surface 34 of submount 32 using mounting pad 20 and the electrical elements 14 and 16, more heat can pass into submount 32 directly below and around LEDs 12. Thermal element 62 can assist with heat dissipation by allowing heat to spread into thermal element 62 where it can dissipate more readily from the device. Heat can also be conducted from top surface 34 of the submount 32 through vias 56 where the heat can spread into first and second surface mount pads 58 and 64 where it can also dissipate. For devices used in surface mount technology, the thickness of thermal element 62 and first and second surface mount pads 58 and 64 can be approximately the same such that all three make contact to a lateral surface such as a PCB. To improve wetting of the solder however, and to ensure a more robust contact between thermal element 62 and an external heat sink, thermal element 62 may extend away from the body of the device to a greater distance than surface mount pads. That is, it is contemplated that thermal element 62 can be thicker than surface mount pads 58 and 64.

FIGS. 8A and 8B illustrate LED devices 50 and 60 further comprising an optical element, for example, a lens 38. Device 10 can likewise comprise such features but for illustration purposes is not shown. Optical element can comprise lens 38 formed over top surface 34 of submount 32, and over the one or more LEDs 12. Lens 38 can provide both environmental and/or mechanical protection. Lens 38 can comprise different locations on top surface 34 with the lens located as shown having LEDs 12 at approximately disposed under the center of the lens base. In some embodiments lens 38 can be formed in direct contact with LEDs 12 and/or top surface 34 of the submount 32. In other embodiments there can be an intervening material or layer between the LEDs 12 and/or top surface 34. Direct contact to the LEDs 12 provides certain advantages such as improved light extraction and ease of fabrication.

Lens 38 can be molded using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that lens 38 can also be textured to improve light extraction or can contain materials such as phosphors or scattering particles.

Lens 38 should also be able to withstand certain shear forces before being displaced from submount 32. In one embodiment, lens 38 can withstand a 1 kilogram (kg) or more shear force. In embodiments of the LED device using silicones that are harder after curing and have a higher durometer reading, such as Shore A 70 or higher, tend to better withstand shear forces. Properties such as high adhesion and high tensile strength may also contribute to the ability of the lens to withstand shear forces. The lens arrangement of LED devices 10 (not shown) 50 and 60 can also easily adapted for use with secondary lens or optics that can be over lens 38 by the end user to facilitate beam shaping. These secondary lenses are generally known in the art, with many of them being commercially available.

LED devices can be fabricated using any suitable method. For example, a substrate (submount) panel that can be diced in subsequent manufacturing steps to provide a plurality of individual submounts. A panel (not shown) can allow for simultaneous fabrication of a plurality of devices. It is understood that a separate processing step may be required for providing the LED device conductive features on the panel. These features can comprise mounting pad 20, electrical elements 14 and 16, bottom pads 58 and 64, conductive vias 44 and thermal element 62, all of which can be arranged to assist in dissipating heat generated by the LED. The panel can comprise a plurality of these features arranged in sets, each of the sets corresponding to one of the plurality of devices to be formed from the panel. Many different panel sizes can be used such as for example, 3 inches by 4 inches, 2 inches by 4 inches, and 4 inches by 4 inches.

A plurality of LEDs 12 can be provided, each of which can be mounted over respective mounting pads 20 on the substrate panel. If LED device comprises four LEDs, the LEDs may be placed and/or mounted individually or simultaneously as a group. A plurality of ESD protection elements, for example, Zener diode 30 can also be provided, each of which can be mounted over mounting pad 20 conjunction with one the LEDs. ESD elements can be mounted to respective mounting pads using the same mounting method and material used to attach one or more LEDs. It is understood that the ESD element can also be mounted in other locations using other methods.

As known in the art, molds (not shown) comprising cavities can be loaded over the panel and arranged over LEDs 12, the mold comprising a lens material and/or encapsulant in liquid form to fill cavities surrounding LEDs 12. In one aspect, lens 38 can comprise liquid curable silicone. LEDs 12 can become embedded in the liquid silicone within one a respective one of the cavities. In one embodiment a layer of silicone can also remain between adjacent lenses to provide protective layer 42 over the top surface of the submount. The liquid silicone can then be cured using known curing processes. The panel can then be removed from the mold and can comprise a plurality of lenses 38, each of which is over a respective one of the LEDs 12. Individual LED devices 10, 50, and/or 60 can then be singulated from the panel using a suitable singulation method, for example, by sawing.

Embodiments of the present disclosure shown in the drawings and described above are exemplary of numerous embodiments that can be made within the scope of the appended claims. It is contemplated that the configurations multiple configuration light emitting devices and methods of making the same can comprise numerous configurations other than those specifically disclosed. It is also contemplated that multiple configuration light emitting devices disclosed herein can be pre-configured where operation at a specific voltage is desired.

What is claimed is:

1. A multi-configurable light emitting diode (LED) device comprising:
   a mounting area comprising an anode pad, a cathode pad, and a plurality of intermediate pads disposed between the anode pad and the cathode pad, wherein the intermediate pads are separated from the anode pad and the cathode pad by a plurality of gaps; and
   a plurality of LEDs disposed over the mounting area, wherein at least two of the plurality of LEDs are electrically configured in parallel when a first intermediate pad of the plurality of intermediate pads is connected to the anode pad via a connector that extends across at least one gap of the plurality of gaps and wherein each of the plurality of LEDs are serially connected when the first intermediate pad of the plurality of intermediate pads is not connected to the anode pad.

2. The LED device according to claim 1, further comprising a submount, wherein the mounting area is disposed over the submount.

3. The LED device according to claim 1, wherein the first intermediate pad connects to the anode pad via wires extending across a gap disposed between the first intermediate pad and the anode pad.

4. The LED device according to claim 1, wherein the LEDs are configured to emit a same color of light.

5. The LED device according to claim 1, wherein the device comprises four LEDs.

6. The LED device according to claim 5, wherein a first LED and a second LED are connected in parallel with a third LED and a fourth LED when the first intermediate pad of the plurality of intermediate pads is connected to the anode pad.

7. The LED device according to claim 6, wherein the first LED and the second LED are serially connected and wherein the third LED and the fourth LED are serially connected.

8. The LED device according to claim 1, further comprising a lens arranged over the plurality of LEDs.

9. The LED device according to claim 1, wherein the mounting area comprises at least two intermediate pads disposed between the anode pad and the cathode pad.

10. The LED device according to claim 1, wherein the mounting area comprises three intermediate pads disposed between the anode pad and the cathode pad.

11. The LED device according to claim 1, wherein the LED device is operable at a first voltage when the first intermediate pad of the plurality of intermediate pads is connected to the anode pad and wherein the LED device is operable at a second voltage when the first intermediate pad of the plurality of intermediate pads remains separate from the anode pad.

12. The LED device according to claim 1, wherein at least one LED of the plurality of LEDs is arranged over each of the plurality of intermediate pads.

13. A multi-configurable light emitting diode (LED) device comprising:
   a mounting pad comprising a plurality of electrically isolated portions, wherein at least one of the electrically isolated portions comprises an anode and at least one other of the electrically isolated portions comprises a cathode and wherein remaining electrically isolated portions are disposed between portions of the anode and the cathode;
   a plurality of LEDs, each arranged over a different one of the electrically isolated portions of the mounting pad for forming a tight point source of light over the plurality of electrically isolated portions,
   wherein the plurality of LEDs are operable at a first voltage range when a first electrically isolated portion of the plurality of electrically isolated portions is connected to the anode via a connector, and wherein the plurality of LEDs are operable at a second voltage range when the first electrically isolated portion of the plurality of electrically isolated portions is not connected to the anode, and
   wherein the first voltage range is different than the second voltage range.

14. The LED device according to claim 13, wherein the plurality of LEDs emit a same color of light.

15. The LED device according to claim 13, wherein each of the electrically isolated portions are separated from each other by one or more gaps disposed therebetween.

16. The LED device according to claim 13, wherein the connector comprises a wire.

17. The LED device according to claim 13, wherein the mounting pad and the at least one of the electrically isolated portions comprising the anode and the at least one other of the electrically isolated portions comprising the cathode comprise a conductive pattern where at least a portion of the mounting pad extends from the at least one other of the electrically isolated portions comprising the cathode.

18. The LED device according to claim 13, further comprising a submount.

19. The LED device according to claim 18, wherein a lens is disposed over the submount.

20. The LED device according to claim 17, further comprising a protective layer disposed over the conductive pattern.

21. The LED device according to claim 13, wherein the first voltage range is between approximately 3 volts (V) and 12V and wherein the second voltage range is greater than 12V.

22. A method for selectively configuring light emitting diodes (LEDs), the method comprising:
   providing an LED device comprising:
      a mounting area comprising an anode pad, a cathode pad, and a plurality of intermediate pads disposed between the anode pad and the cathode pad, wherein the intermediate pads are separated from the anode pad and the cathode pad by a plurality of gaps; and
      a plurality of LEDs disposed over the mounting area, wherein at least two of the plurality of LEDs are selectively configurable in multiple different electrical arrangements, including a parallel arrangement and a serial arrangement,
      wherein the at least two LEDs are configurable in the parallel arrangement when a first intermediate pad of the plurality of intermediate pads is connected to the anode pad via a connector extending across at least one gap of the plurality of gaps and
      wherein the at least two LEDs are configurable in the serial arrangement when the first intermediate pad of the plurality of intermediate pads is not connected to the anode pad;
   and
   selecting an electrical arrangement from the multiple different electrical arrangements and configuring the at least two LEDs according to the electrical arrangement selected.

23. The method according to claim 22, further comprising:
   providing a first group of LEDs arranged over the mounting pad;
   providing a second group of LEDs arranged over the mounting pad; and
   selectively configuring the second group of LEDs by electrically connecting the LEDs of the second group in series or in parallel.

24. The method according to claim 23, further comprising electrically connecting the first group of LEDs in parallel with the second group of LEDs.

25. The method according to claim 22, wherein the plurality of LEDs are all a same color.

26. The method according to claim 22, wherein the plurality of LEDs are different colors.

27. The method according to claim 22, comprising selectively configuring the LED device to operate at different desired voltages.

28. A multi-configurable light emitting diode (LED) device comprising:
   a plurality of electrically isolated portions, each of the plurality of electrically isolated portions being separated by a gap, wherein at least one of the plurality of electrically isolated portions comprises an anode and at least one other of the plurality of electrically isolated portions comprises a cathode, and wherein the remaining electrically isolated portions are disposed between portions of the anode and the cathode;
   a plurality of LEDs each arranged over at least a different one of the electrically isolated portions; and
   wherein the LEDs are selectively configurable in multiple different electrical arrangements between the at least one of the plurality of electrically isolated portions which comprises the anode and the at least one of the plurality of electrically isolated portions which comprises the cathode, including each of the following arrangements between the anode and the cathode:
      (i) each LED is connected in series with each other LED when a first electrically isolated portion is connected to the cathode by a connector extending across a gap therebetween, a last electrically isolated portion is connected to the anode by a connector extending across a gap therebetween, and each remaining electrically isolated portion is connected only to immediately preceding and proceeding electrically isolated portions by a connector extending across gaps therebetween, and
      (ii) at least one LED is connected both in series and in parallel with at least one other LED when at least two of the electrically isolated portions are connected to the anode via a connector extending across the gap.

* * * * *